(12) United States Patent
Banner et al.

(10) Patent No.: US 8,264,154 B2
(45) Date of Patent: Sep. 11, 2012

(54) METHOD AND APPARATUS FOR PULSED PLASMA PROCESSING USING A TIME RESOLVED TUNING SCHEME FOR RF POWER DELIVERY

(75) Inventors: Samer Banner, San Jose, CA (US); Valentin Todorow, Palo Alto, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 556 days.

(21) Appl. No.: 12/465,319

(22) Filed: May 13, 2009

(65) Prior Publication Data

US 2009/0284156 A1    Nov. 19, 2009

Related U.S. Application Data

(60) Provisional application No. 61/127,634, filed on May 14, 2008.

(51) Int. Cl.
*H01J 7/24* (2006.01)
(52) U.S. Cl. .................. 315/111.71; 315/311; 315/344
(58) Field of Classification Search .................. 315/34, 315/111.21, 111.71, 160, 310–311, 326, 315/344, 348, 360; 307/43; 333/17.1, 17.3, 333/99 PL
See application file for complete search history.

(56) References Cited

U.S. PATENT DOCUMENTS

| | | | | |
|---|---|---|---|---|
| 5,556,549 A | * | 9/1996 | Patrick et al. | 216/61 |
| 5,971,591 A | * | 10/1999 | Vona et al. | 700/220 |
| 6,174,450 B1 | * | 1/2001 | Patrick et al. | 216/61 |
| 6,353,206 B1 | * | 3/2002 | Roderick | 219/121.52 |
| 6,472,822 B1 | | 10/2002 | Chen et al. | |
| 6,818,562 B2 | * | 11/2004 | Todorow et al. | 438/710 |
| 7,967,944 B2 | * | 6/2011 | Shannon et al. | 156/345.28 |
| 2004/0045506 A1 | * | 3/2004 | Chen et al. | 118/723 I |
| 2004/0107906 A1 | * | 6/2004 | Collins et al. | 118/723 I |

OTHER PUBLICATIONS

International Search Report and Written Opinion mailed Dec. 29, 2009 for PCT Application No. PCT/US2009/043771.

* cited by examiner

*Primary Examiner* — Jason M Crawford
(74) *Attorney, Agent, or Firm* — Moser Taboada; Alan Taboada

(57) ABSTRACT

Embodiments of the present invention generally provide methods and apparatus for pulsed plasma processing over a wide process window. In some embodiments, an apparatus may include an RF power supply having frequency tuning and a matching network coupled to the RF power supply that share a common sensor for reading reflected RF power reflected back to the RF power supply. In some embodiments, an apparatus may include an RF power supply having frequency tuning and a matching network coupled to the RF power supply that share a common sensor for reading reflected RF power reflected back to the RF power supply and a common controller for tuning each of the RF power supply and the matching network.

21 Claims, 3 Drawing Sheets

METHOD AND APPARATUS FOR PULSED PLASMA PROCESSING USING A TIME RESOLVED TUNING SCHEME FOR RF POWER DELIVERY

CROSS REFERENCE TO RELATED APPLICATIONS

This application claims the benefit of U.S. Provisional Patent Application Ser. No. 61/127,634, filed May 14, 2008, which is herein incorporated by reference.

BACKGROUND

1. Field

Embodiments of the present invention generally relate to semiconductor substrate processing systems and, more specifically, to methods and apparatus for processing substrates using a pulsed plasma.

2. Description of the Related Art

In semiconductor integrated circuit (IC) fabrication, devices such as component transistors are formed on a semiconductor wafer substrate that is typically made of silicon. During the fabrication process, various materials are deposited on different layers in order to build or form the desired integrated circuit. The various layers define devices that are interconnected by metallization lines. During certain plasma enhanced processes that are performed upon wafers (also referred to in the art as substrates) that already contain devices and metalized lines, a substantial amount of charge may accumulate on the surface of the wafer. This charge accumulation may not be uniform across the wafer. As such the charge accumulation may cause destructive currents to be induced in some of the metalized materials and/or cause arcing within dielectric layers. The currents and/or arcing may destroy or damage certain devices that have previously been formed on the wafer. To mitigate the charging effects and avoid charging damage, the power supplied to a plasma within a plasma enhanced reactor may be pulsed. As such, the power coupled to the plasma is pulsed during all or part of the plasma enhanced process. One example of such a technique for use in an etch reactor is disclosed in U.S. Pat. No. 6,255,221, issued Jul. 3, 2001.

One drawback of using a pulsed plasma etch reactor is that the power from an RF generator or RF source must be coupled through a dynamically tuned matching network (also referred to as a match unit) to an antenna or electrode within a plasma reactor. The pulsed power is coupled from the antenna or electrode to process gases within the reactor to form a plasma that is used for the etching process. The matching network ensures that the output of the RF source is efficiently coupled to the plasma to maximize the amount of energy coupled to the plasma. The matching network matches the, typically, 50 ohms to a complex impedance of the plasma. To facilitate dynamic matching as the plasma characteristics change during processing, the matching network is continuously adjustable to ensure that a match is achieved and maintained throughout processing.

Generally, a controller that executes the process recipe controls the matching network. The controller also monitors the reflected power from the matching network. If the reflected power from the matching network rises, the controller will adjust the capacitance or inductance of the matching network to achieve a more sufficient match for the RF source to the existing plasma within the chamber. Since the matching networks for coupling high power RF energy to a plasma generally contain mechanically tunable elements (i.e., capacitors and/or inductors), the tuning process may be slow compared to the pulse length of the RF pulse that is desired to be coupled to the plasma. As such, when pulsing power into the matching network as the network is adjusted with each pulse, the reflected power may be sporadic or inconsistent with actual reflected power, causing the controller to under or over adjust the matching network. Such continuous adjustment may cause excessive reflected power and a reduction in plasma power coupling efficiency.

Therefore, there is a need in the art for improved methods and apparatus for operating a plasma enhanced semiconductor wafer processing using pulsed power.

SUMMARY

Embodiments of the present invention generally provide methods and apparatus for pulsed plasma processing over a wide process window. In some embodiments, an apparatus may include an RF power supply having frequency tuning and a matching network coupled to the RF power supply that share a common sensor for reading reflected RF power reflected back to the RF power supply. In some embodiments, an apparatus may include an RF power supply having frequency tuning and a matching network coupled to the RF power supply that share a common sensor for reading reflected RF power reflected back to the RF power supply and a common controller for tuning each of the RF power supply and the matching network.

In some embodiments, a tuning procedure is provided for enabling pulsed plasma processing over a wide range of process recipes, or parameters. In some embodiments, the tuning procedure may include igniting a plasma in a continuous wave (CW) mode, while having the source and the bias generators at fixed frequency and the matching networks in automatic mode. Once the matching networks adjust to ensure minimum reflected power from both the source and the bias (about 2-3 sec) the source matching network parameters are held constant while keeping the bias one in automatic mode. This followed by turning on the frequency tuning for the source generator while keeping it off for the bias generator. After about 1 sec, the pulsing mode is turned on, followed by turning on the frequency tuning for the bias generator and sending back the source matching network to an automatic mode. It takes another 2-4 sec (depending upon the presets of the matching network and on the recipe's parameters) for the system to stabilize and achieve minimum reflected power.

In some embodiments, a method for tuning a system operating a plasma process using a source RF power supply and a bias RF power supply in a master/slave arrangement, each capable of frequency tuning and respectively coupled to a process chamber via a source matching network and a bias matching network is provided. The method may include first igniting a plasma in a process chamber using the source RF power supply and the bias RF power supply, each set in a continuous wave mode and in a fixed frequency mode, with the source matching network and the bias matching network each set in an automatic tuning mode. Next, the source matching network may be changed to hold mode while keeping the bias matching network in automatic mode after the matching networks adjust to reduce reflected power from both the source and the bias RF generators. Frequency tuning can be turned on for the source RF power supply while keeping it off for the bias generator. Pulsing mode can be turned on for the source RF power supply and/or the bias RF power supply. The bias RF power supply can then be placed in frequency tuning mode.

In some embodiments, the tuning procedure may include setting the generators into pulsing mode with the desired pulsing frequency, but with about a 90% duty cycle. Turn on the frequency tuning for both the bias and the source and set the matching networks into an automatic mode. After doing so, turn on the RF generators. It will take the system about 2-3 sec to stabilize and adjust itself to the minimum reflected power. Afterward, while the generators are still on, change the duty cycle from about 90% to the desired duty cycle within the window of operation. It will take the system another 2-3 sec to tune itself and then it is ready for operation at the desired pulsing mode.

In some embodiments, a method for tuning a system operating a plasma process using a source RF power supply and a bias RF power supply in a master/slave arrangement, each capable of frequency tuning and respectively coupled to a process chamber via a source matching network and a bias matching network is provided. The method may include: (a) forming a plasma in a process chamber by providing RF power from the source RF power supply and/or the bias RF power supply at a desired pulsing frequency and an initial duty cycle of between about 85 to about 95 percent in frequency tuning mode with the source matching network and the bias matching network in automatic tuning mode; and (b) while the source RF power supply and the bias RF power supply are still on, changing the initial duty cycle to a desired duty cycle after the matching networks adjust to reduce reflected power from both the source and the bias RF generators.

In some embodiments, a method for tuning a system operating a plasma process in a time resolved manner using a source RF power supply and a bias RF power supply, each capable of frequency tuning and respectively coupled to a process chamber via a source matching network and a bias matching network may be provided. The method may include igniting a plasma in a process chamber using the source RF power supply and the bias RF power supply, each independently set in a first operational mode selected from either a continuous wave mode or a pulsing mode and in a first tuning mode selected from either a fixed frequency mode or a frequency tuning mode, with the source matching network and the bias matching network each independently set in a first match mode selected from either an automatic tuning mode or a hold mode. Upon expiration of a first period of time, the first operational mode of one or both of the source RF power supply and the bias RF power supply may be switched. Upon expiration of a second period of time, the first tuning mode of one or both of the source RF power supply and the bias RF power supply may be switched. Upon expiration of a third period of time, the first match mode of one or both of the source matching network and the bias matching network may be switched. The first, second, and third periods of time are selected to reduce a reflected power reflected back to the source RF power supply and the bias RF power supply.

Other and further embodiments are provided in the detailed description, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides methods and apparatus for processing substrates using a pulsed plasma. In some embodiments, a plasma pulsing process for either or both of the bias and the source that may facilitate better performance (better etch uniformity and selectivity) with less damage at the wafer level as well as reducing trenching and notching problems. Embodiments of the present invention provides procedures that enable a stable window of operation for pulsing mode using the RF generators having frequency tuning (also referred to as frequency sweep) in combination with dynamic matching networks. As the time needed to get the system tuned is critical during the etch process, one advantage of these procedures is being able to tune within less than about 6 sec while pulsing, thereby minimizing the time during which the wafer is exposed to unstable plasma. Although the description below may refer to certain processes, RF frequencies, and RF powers, the teachings provided herein may generally be utilized to advantage for other processes, other frequencies, and other power levels.

Figure 1:
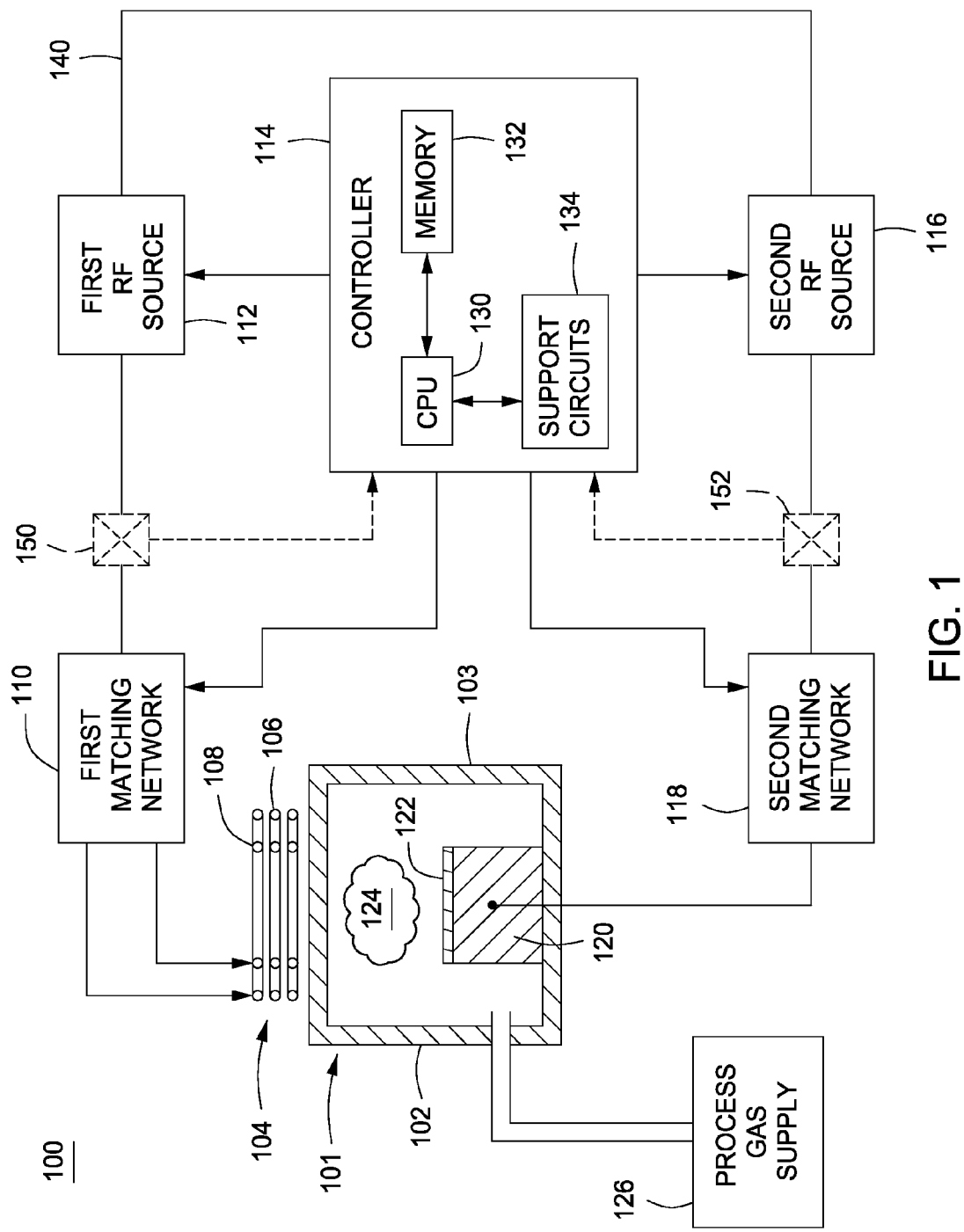
FIG. 1 is a schematic diagram of a semiconductor wafer processing system in accordance with some embodiments of the present invention.

FIG. 1 is a plasma enhanced semiconductor wafer processing system 100 that in one embodiment is used for etching semiconductor wafers 122 (or other substrates and work pieces). Although disclosed embodiments of the invention is described in the context of an etch reactor and process, the invention is applicable to any form of plasma process that uses pulsed power during a plasma enhanced process. Such reactors include plasma annealing; plasma enhanced chemical vapor deposition, physical vapor deposition, plasma cleaning, and the like.

This illustrative system 100 comprises an etch reactor 101, a process gas supply 126, a controller 114, a first RF power supply 112, a second RF power supply 116, a first matching network 110, and a second matching network 118. Either or both of the first and second RF power supplies 112, 116 may be configured for fast frequency tuning (e.g., the source may be able to vary frequency within about +/−5 percent in response to a sensed reflected power measurement in order to minimize reflected power). Such frequency tuning may require about 100 micro-seconds or much less to minimize the reflected power from a plasma in a given steady state. Each RF power supply (112, 116) may be operable in a continuous wave (CW) or pulsed mode. When in pulse mode, either power source (112, 116) may be pulsed at a pulse frequency of up to about 100 kHz, or in some embodiments, between about 100 Hz to about 100 kHz. Either power source (112, 116) may be operated at a duty cycle (e.g., the percentage of on time during the total of on time and off time in a given cycle) of between about 10% and about 90%.

The etch reactor 101 comprises a vacuum vessel 102 that contains a cathode pedestal 120 that forms a pedestal for the wafer 122. The roof or lid 103 of the process chamber has at least one antenna assembly 104 proximate the roof 103. The antenna assembly 104, in some embodiments of the invention, comprises a pair of antennas 106 and 108. Other embodiments of the invention may use one or more antennas or may use and electrode in lieu of an antenna to couple RF energy to a plasma. In this particular illustrative embodiment, the antennas 106 and 108 inductively couple energy to the process gas or gases supplied by the process gas supply 126 to the interior of the vessel 102. The RF energy supplied by the antennas 106 and 108 is inductively coupled to the process gases to form a plasma 124 in a reaction zone above the wafer 122. The reactive gases will etch the materials on the wafer 122.

In some embodiments, the power to the antenna assembly 104 ignites the plasma 124 and power coupled to the cathode pedestal 120 controls the plasma 124. As such, RF energy is coupled to both the antenna assembly 104 and the cathode pedestal 120. The first RF power supply 112 (also referred to as a source RF power supply) supplies energy to a first matching network 110 that then couples energy to the antenna assembly 104. Similarly, a second RF power supply 116 (also referred to as a bias RF power supply) couples energy to a second matching network 118 that couples energy to the cathode pedestal 120. A controller 114 controls the timing of activating and deactivating the RF power supplies 112 and 116 as well as tuning the first and second matching networks 110 and 118. The power coupled to the antenna assembly 104 known as the source power and the power coupled to the cathode pedestal 120 is known as the bias power. In the embodiments of the invention, either the source power, the bias power, or both can be operated in either a continuous wave (CW) mode or a pulsed mode.

In some embodiments, a link 140 may be provided to couple the first and second RF supplies 112, 116 to facilitate synchronizing the operation of one source to the other. Either RF source may be the lead, or master, RF generator, while the other generator follows, or is the slave. The link 140 may further facilitate operating the first and second RF supplies 112, 116 in perfect synchronization, or in a desired offset, or phase difference.

A first indicator device, or sensor, 150 and a second indicator device, or sensor, 152 are used to determine the effectiveness of the ability of the matching networks 110, 118 to match to the plasma 124. In some embodiments, the indicator devices 150 and 152 monitor the reflective power that is reflected from the respective matching networks 110, 118. These devices are generally integrated into the matching networks 110, 118, or power supplies 112, 115; However, for descriptive purposes, they are shown here as being separate from the matching networks 110, 118. When reflected power is used as the indicator, the devices 150 and 152 are coupled between the supplies 112, 116 and the matching networks 110 and 118. To produce a signal indicative of reflected power, the devices 150 and 152 are directional couplers coupled to a RF detector such that the match effectiveness indicator signal is a voltage that represents the magnitude of the reflected power. A large reflected power is indicative of an unmatched situation. The signals produced by the devices 150 and 152 are coupled to the controller 114. In response to an indicator signal, the controller 114 produces a tuning signal (matching network control signal) that is coupled to the matching networks 110, 118. This signal is used to tune the capacitor or inductors in the matching networks 110, 118. The tuning process strives to minimize or achieve a particular level of, for example, reflected power as represented in the indicator signal. The matching networks 110, 118 typically may require between about 100 microseconds to about a few milliseconds to minimize reflected power from a plasma in a given steady state.

Figure 3:
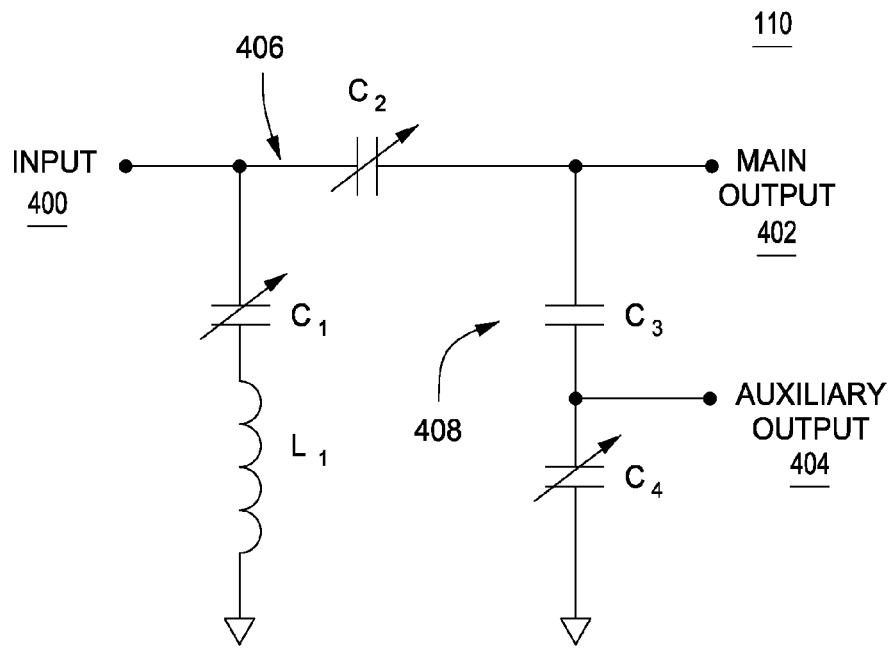
FIG. 3 is an exemplary match circuit suitable for use in connection with some embodiments of the present invention.

FIG. 3 depicts a schematic diagram of an illustrative matching network used, for example, as the first RF matching network 110. This particular embodiment has a single input 400 and a dual output (i.e., main output 402 and auxiliary output 404). Each output is used to drive one of the two antennas. The matching circuit 406 is formed by C1, C2 and L1 and a capacitive power divider 408 is formed by C3 and C4. The capacitive divider values are set to establish a particular amount of power to be supplied to each antenna. The values of capacitors C1 and C2 are mechanically tuned to adjust the matching of the network 110. Either C1 or C2 or both may be tuned to adjust the operation of the network. In lower power systems, the capacitors may be electronically tuned rather than mechanically tuned. Other embodiments of a matching network may have a tunable inductor. This source power supply may be operated in pulse or CW mode. The source power that is matched by the network 110 is at about 13.56 MHz and has a power level of up to about 3000 watts. Such a matching network is available under model NAVIGATOR 3013-ICP85 from AE, Inc. of Fort Collins, Colo. Still other various configurations of match networks may be utilized in accordance with the teachings provided herein.

Figure 4:
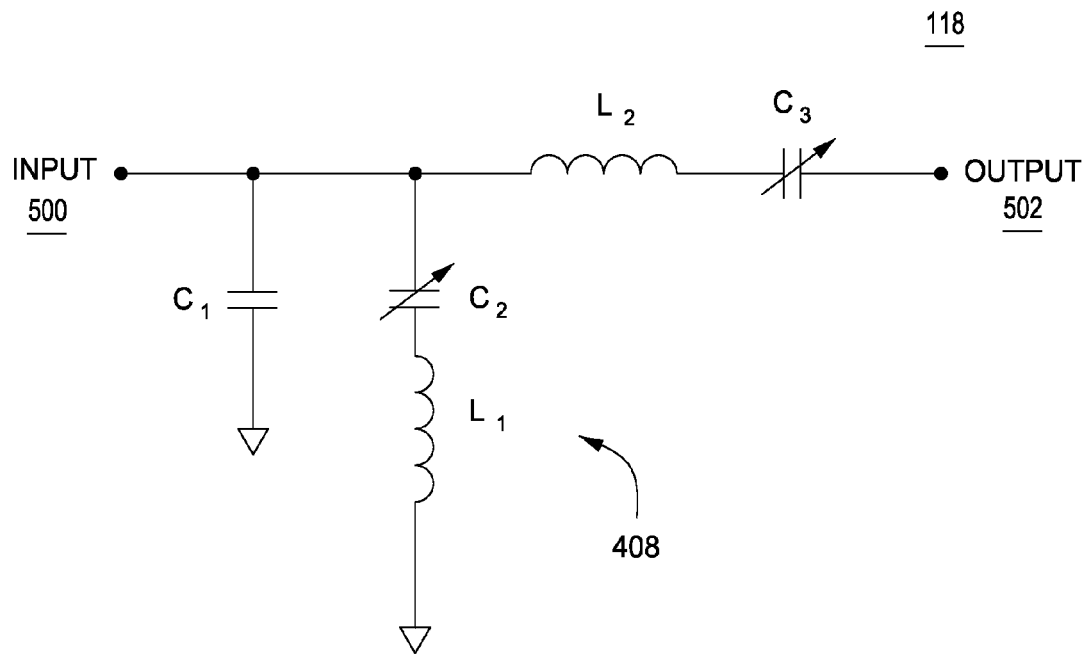
FIG. 4 is an exemplary match circuit suitable for use in connection with some embodiments of the present invention.

FIG. 4 depicts a schematic diagram of one embodiment of an illustrative matching network used, for example, as the second RF matching network 118. This particular embodiment has a single input 500 and a single output 502. The output is used to drive the pedestal. The matching network comprises capacitors C1, C2, C3, L1 and L2. The values of capacitors C2 and C3 are mechanically tuned to adjust the matching of the network 116. Either C2 or C3 or both may be tuned to adjust the operation of the network. In lower power systems, the capacitors may be electronically tuned rather than mechanically tuned. Other embodiments of a matching network may have a tunable inductor. This bias power supply 116 may be operated in pulse or CW mode. In pulse mode, pulses can occur at a frequency of 100 Hz-100 KHz and a duty cycle of 10-90%. In one embodiment, bias power has a frequency of about 13.56 MHz and has a power level of about 1500 watts. Such a matching network is available under model NAVIGATOR 1013-L35Z from AE, Inc. of Fort Collins, Colo. Still other various configurations of match networks may be utilized in accordance with the teachings provided herein.

The controller 114 comprises a central processing unit (CPU) 130, a memory 132 and support circuits 134. The controller 114 is coupled to various components of the system 100 to facilitate control of the etch process. The controller 114 regulates and monitors processing in the chamber via interfaces that can be broadly described as analog, digital, wire, wireless, optical, and fiberoptic interfaces. To facilitate control of the chamber as described below, the CPU 130 may be one of any form of general purpose computer processor that can be used in an industrial setting for controlling various chambers and subprocessors. The memory 132 is coupled to the CPU 130. The memory 132, or a computer readable medium, may be one or more readily available memory devices such as random access memory, read only memory, floppy disk, hard disk, or any other form of digital storage either local or remote. The support circuits 134 are coupled to the CPU 130 for supporting the processor in a conventional manner. These circuits include cache, power supplies, clock circuits, input/output circuitry and related subsystems, and the like.

Etching, or other, process instructions are generally stored in the memory 132 as a software routine typically known as a recipe. The software routine may also be stored and/or executed by a second CPU (not shown) that is remotely located from the hardware being controlled by the CPU 130. The software routine, when executed by CPU 130, transforms the general purpose computer into a specific purpose computer (controller) 114 that controls the system operation such as that for controlling the plasma during the etch process. Although the process of the present invention can be implemented as a software routine, some of the method steps that are disclosed therein may be performed in hardware as well as by the software controller. As such, embodiments of the invention may be implemented in software as executed upon a computer system, and hardware as an application specific integrated circuit or other type of hardware implementation, or a combination of software and hardware.

Conventional matching networks and generators typically each contain control algorithms used for tuning the respective systems that are independent. Accordingly, each algorithm is not linked to the other with respect to the time or manner in which they both should be aiming to reduce the reflected power to the generator. The lack of such a link might cause a significant competition between the two tuning algorithms, and therefore, might cause system instabilities. In order to overcome this problem, in some embodiments of the present invention, an integrated matching network may be embedded within the RF generator with frequency tuning capability (e.g., the first or second RF source 112 or 116) while the algorithms used for tuning the matching network as well as the frequency with the RF cycle may both be controlled based on the same readings as measured at the generator output (e.g., using a shared sensor). By doing so, the competition between the two independent algorithms may be eliminated and the window of operation for pulsed-plasma based reactors may be increased. In some embodiments, the first RF source 112 and the first matching network 110 (and/or the second RF source 116 and the second matching network 118) may be physically integrated or may merely share a controller directing the tuning process for the pair of devices to eliminate the tuning competition between the two and to maximize the tuning efficiency of the overall system. In some embodiments, the first RF source 112 and the first matching network 110 (and/or the second RF source 116 and the second matching network 118) may merely share a common sensor for reading the reflected power such that they are at least tuning to minimize reflected power off of the same reading.

Figure 2:
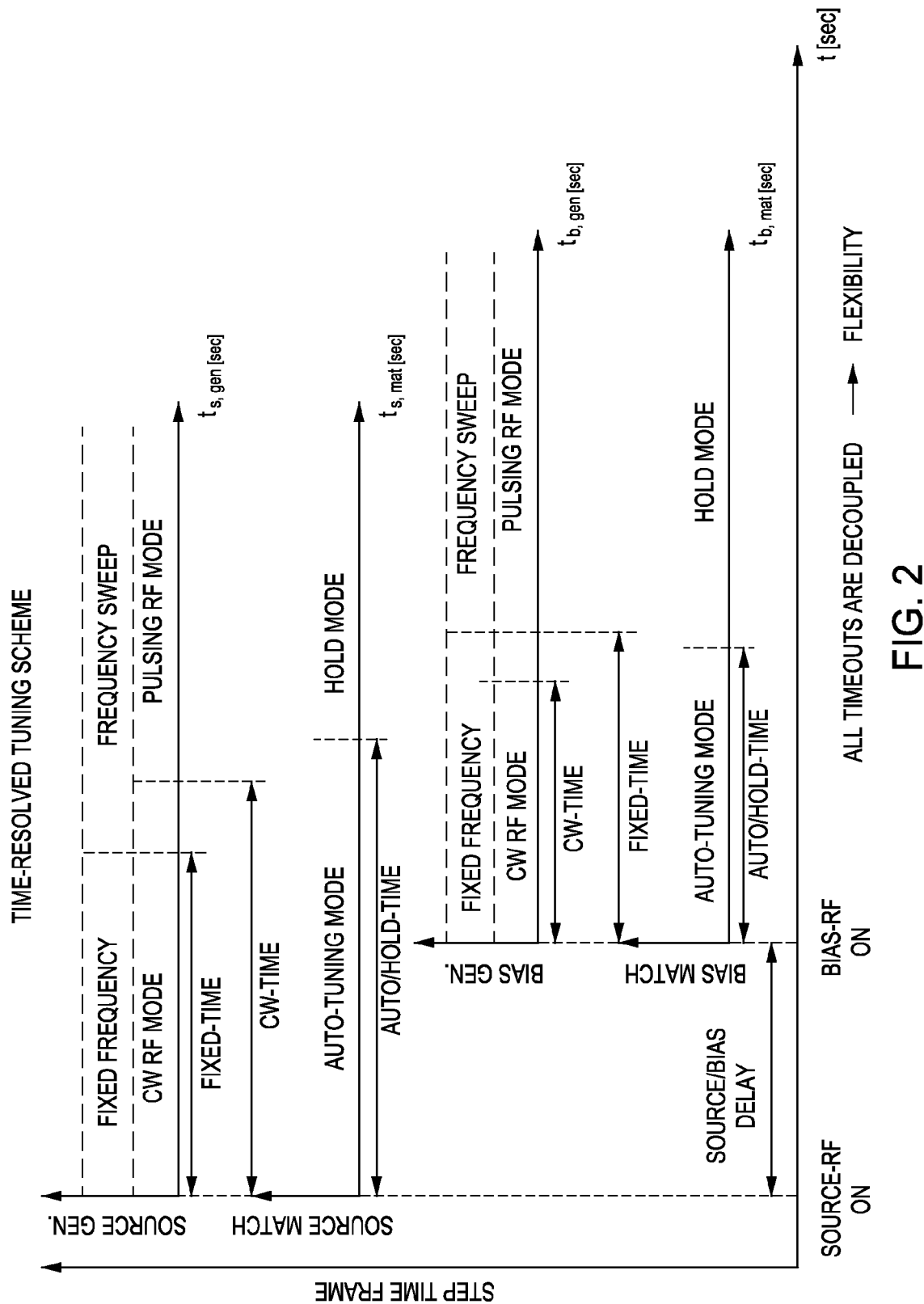
FIG. 2 is a schematic chart showing the independent timing features of matching networks and RF generators in accordance with some embodiments of the present invention.

FIG. 2 depicts a diagram of variables that may be independently controlled over time to facilitate matching the impedance of the plasma to the impedance of the RF source over a wide range of pulsed plasma processes. FIG. 2, shows time independent operational parameters for each of a source generator, source match, bias generator, and bias match. These parameters are decoupled and may be independently controlled. The source and bias generators may be operated in a fixed frequency mode or in a frequency sweep (or frequency tuning) mode. In addition, the source and bias generators may be operated in a CW RF mode or a pulsing RF mode. Each generator may switch at a desired time between modes of operation independently and may be synched to operate together, or may be offset by a desired quantity, as shown by the source/bias delay between the source RF on and bias RF one times. Such synchronization or controlled out of phase operation may also be applied to operation in any of the operational modes of the generators (for example, when both in pulsing RF mode).

The source and bias matching networks (e.g., source match and bias match in FIG. 2) can each independently operate in autotuning mode or hold mode (in which the matching network fixes values of components in the match and does not tune to minimize reflected power). Switching between each of these modes can be independently controlled to facilitate minimizing reflected power and stabilizing plasma processing during pulsed plasma processes across a wide process window as discussed in more detail below. Thus, for pulsed plasma processes the following control "knobs" may be provided to facilitate efficient operation over a wide range of processes: each match network may run independently in autotune or hold mode; frequency tuning of each RF generator may be on or off; time A (start in about 90% or CW, then switch to pulsing after time A); time B (start with frequency tuning off, then turn it on after time B); time C (match network may be in autotune mode initially, then may be fixed after time C or finding a position of minimized RF power reflection). In addition, the "timeout" or time to make the switch between modes may be set such that the switch does not occur (e.g., setting the time to switch to a duration longer than that of a process to be performed) or such that the switched mode is the immediate mode of operation (e.g., setting the time to switch to be zero). As each of the times for these knobs are independent, control of each parameter may be utilized to facilitate pulsed plasma operation over a wider range of processes. As such, a time-resolved tuning procedure for RF power delivery is provided herein, as discussed in more detail below, that enables stable pulsed plasma processing over a wide range of process chemistries, pressures, power levels, and the like. The time-dependent nature of such a scheme enables determination of the sequence of operation of the different knobs in order to optimize the RF delivery during pulsed plasma operation for large variety of plasma-based processes.

Using the above "timeouts" the system 100 may be operated in various RF modes which may be tuned in a time resolved manner by control of the above variables. For example, in some embodiments, a method for tuning a system operating a plasma process in a time resolved manner using a source RF power supply and a bias RF power supply, each capable of frequency tuning and respectively coupled to a process chamber via a source matching network and a bias matching network may be provided. The method may include igniting a plasma in a process chamber using the source RF power supply and the bias RF power supply, each independently set in a first operational mode selected from either a continuous wave mode or a pulsing mode and in a first tuning mode selected from either a fixed frequency mode or a frequency tuning mode, with the source matching network and the bias matching network each independently set in a first match mode selected from either an automatic tuning mode or a hold mode. Upon expiration of a first period of time, the first operational mode of one or both of the source RF power supply and the bias RF power supply may be switched. Upon expiration of a second period of time, the first tuning mode of one or both of the source RF power supply and the bias RF power supply may be switched. Upon expiration of a third period of time, the first match mode of one or both of the source matching network and the bias matching network may be switched. The first, second, and third periods of time are selected to reduce a reflected power reflected back to the source RF power supply and the bias RF power supply.

For example, using the above "timeouts" the system 100 may be operated in various RF modes, depending upon the control of the above variables. In some embodiments, the system 100 may be operated with either RF generator (e.g., RF power supply 112 or 116) in a continuous wave (CW) mode. In such a mode the respective generator is in a fixed mode, a CW mode, and in a master mode. This mode applies for both the source and the bias generators and each one operates independently.

In some embodiments, the system 100 may be operated with either RF generator in a CW-Pulse mode. In such a mode, the respective generator is in a fixed mode and in a master mode. The respective generator is in a CW mode for a configurable timeout "CW/Pulse time" and it switches to pulsing mode after this timeout. This mode applies for both the source and the bias generators and each one operates independently.

In some embodiments, the system 100 may be operated with either RF generator in a CW-Frequency mode. In such a mode, the respective generator is in a CW mode and in a master mode. The generator is in a fixed mode for a configurable timeout "Fixed Freq time" and it turns the frequency tuning on after this timeout. This mode applies for both the source and the bias generators and each one operates independently.

In some embodiments, the system 100 may be operated with either RF generator in a CW-Frequency-Pulse mode. In such a mode, the respective generator is in a CW mode for a configurable timeout "CW/Pulse time" and it switches to pulsing mode after this timeout. The generator is also in a fixed mode for a configurable timeout "Fixed Freq time" and it turns the frequency tuning on after this timeout. The generator is in a master mode, and therefore, it operates independently. This mode applies for both the source and the bias generators.

In some embodiments, the system 100 may be operated with either RF generator in a Pulse-Frequency-Pulse mode. In such a mode, the respective generator is in pulsing mode (at a high, for example, 90%, duty cycle) for a configurable timeout "CW/Pulse time" and it switches to the desirable pulse parameters after this timeout. The generator is also in a fixed mode for a configurable timeout "Fixed Freq time" and it turns the frequency tuning on after this timeout. The generator is in a master mode, and therefore, it operates independently. This mode applies for both the source and the bias generators In some embodiments, the system 100 may be operated in a CW-Frequency-SyncPulse mode. In such a mode, the source generator is in a master mode while the bias is in a slave mode. The source generator is in a CW mode for a configurable timeout "CW/Pulse time" and it switches to pulsing mode after this timeout. The source generator is in a fixed mode for a configurable timeout "Fixed Freq time" and it turns the frequency tuning on after this timeout. The bias generator pulses at the same pulse frequency and duty cycle as of the source generator. The source and the bias are fully synchronized while the master/slave delay is initially set to zero. The delay between the pulses is controlled by a configurable timeout "Pulsing delay for slave Bias RF" providing up to 360 degree phase control. The master/slave delay may apply to all the synchronized pulsing steps within a particular recipe.

In some embodiments, the system 100 may be operated in a CW-Frequency-SyncPulse mode. In such a mode, the source generator is in a master mode while the bias is in a slave mode. The source generator is in pulsing mode (90% duty cycle) for a configurable timeout "CW/Pulse time" and it switches to the desirable pulse parameters after this timeout. The source generator is in a fixed mode for a configurable timeout "Fixed Freq time" and it turns the frequency tuning on after this timeout. The bias generator pulses at the same pulsing frequency and duty cycle as the source generator. The source and the bias generators are fully synchronized while the master/slave delay is initially set to zero. The delay between the pulses is controlled by a configurable timeout "Pulsing delay for slave Bias RF" providing up to 360 degree phase control. The master/slave delay may apply to all the synchronized pulsing steps within a particular recipe.

In some embodiments, the lowest reflected power possible can be provided if the matching network operation is controlled properly. For CW/Pulsed modes of operation the match can be in either one of two main modes: Automatic mode or Hold mode. The automatic mode is not recommended to operate solely during pulsed mode as the match typically cannot track the fast changes within the pulse, and therefore, poor tuning is achieved if at all, unless the pulse frequency is very low. In some embodiments, the match may be operated in hold mode whenever the system is in a pulsed mode unless there is a critical need for extra knob to tune the system along with the frequency tuning.

In some embodiments, it has been observed that a 90% duty cycle for a given pulse frequency behaves similarly to CW mode. Hence, tuning the system is relatively easy. However, you still benefit from the system being in pulsed mode. Therefore, for certain conditions the Pulse-Freq-Pulse or Pulse-Freq-SyncPulse mode might achieve lower reflected power than the CW-Freq-Pulse or CW-Freq-SyncPulse modes. If either one of the pulse parameters (pulse frequency and duty cycle) is set to zero the generator will operate in CW mode As the pulsed mode might be utilized under different conditions (pressure/power levels/chemistries) one can recommend typical timeouts, however for each new recipe some optimization need to be done in order to ensure stable plasma with the lowest reflected power. In what follows typical recommended modes of operation at pulsed modes are presented: Source pulsing & bias CW, Bias pulsing & source CW, or Synchronized source and bias pulsing. However, other modes might apply for different applications. Timeouts settings might need to be modified when changing process parameters, such as process chemistries, chamber pressures, RF power levels, divider cap settings and pulse parameters.

As an illustrative example, in some embodiments, the system 100 may be operated with the source generator in pulsing mode and the bias generator in a CW mode. In such an embodiments, the source generator may be set to a CW-Freq-Pulse mode. A CW/Pulse time may be selected to control how long the generator is in CW mode, for example 6 seconds. This time could be reduced to no less than 4 seconds to ensure that the system is tuned at the CW mode before switching to pulsing mode. A Fixed/Freq time may be selected to control how long the generator is in fixed mode before switching the frequency tuning on, for example, about 5 seconds. In some embodiments. the frequency tuning may be turned on about 1 second before/after the pulsing mode starts (assuming that the corresponding match is on Hold). In some embodiments, the match should not be in automatic mode along with the frequency tuning, therefore the match may be put in Hold mode prior to turning on the frequency tuning. Overlap might take place for short time—for example, no longer than 5 seconds—to ensure the best tuning position for pulsed plasma operation.

The bias generator is set in CW-Freq. Therefore, the bias match may be set to Auto-Hold mode. A hold time may be selected to control how long the match will be in "Auto" mode before it switches to "Hold." In some embodiments, the match time may be at least 1 sec shorter than the generator CW/Pulse time and the Fixed-Freq time. The match hold time should not be below a suitable value, for example, about 3 seconds, that would prevent the system to have enough time to tune.

In some embodiments, depending on the chemistry used, the transition from CW mode to pulsing mode might be extremely pronounced in terms of plasma load. In such a case, the Pulse_Freq_Pulse mode may be effectively utilized for source pulsing. Once the system is tuned at 90% duty cycle, the transition to the desired duty cycle (for example, 50%) is smoother than switching from CW. In some embodiments, this technique may be utilized for processes operating at low pressure (e.g., below 10 mTorr).

Alternatively, in some embodiments, the system 100 may be operated with the bias generator pulsing and the source generator fixed. When the bias generator is set to CW-Freq-Pulse mode. A CW/Pulse time may be selected to control how long the generator is in CW mode, for example 6 seconds. This time could be reduced to no less than 4 seconds to ensure that the system is tuned at the CW mode before switching to pulsing mode. A Fixed/Freq time may be selected to control how long the generator is in fixed mode before switching the frequency tuning on, for example, about 5 seconds. In some embodiments. the frequency tuning may be turned on about 1 second before/after the pulsing mode starts (assuming that the corresponding match is on Hold). In some embodiments, the match should not be in automatic mode along with the frequency tuning, therefore the match may be put in Hold mode prior to turning on the frequency tuning. Overlap might take place for short time—for example, no longer than 5 seconds—to ensure the best tuning position for pulsed plasma operation.

In such a mode of operation the source generator may be provided in CW mode or CW-Freq mode. When the source generator is in CW mode and not frequency tuning, its corresponding match may be in Auto-Hold mode. However the match may switch to hold after a period of time (for example, about 8 seconds) to allow the source to tune after the bias generator switches to pulse mode. In some embodiments, the source generator may be set in CW-Freq mode rather than in CW mode. Therefore, the source match may be set to Auto-Hold mode. The hold time is typically less than the Fixed-Freq-time to avoid any possible competition. The match hold time may be at least about 1 second shorter than the generator CW/Pulse time and the Fixed-Freq time. The match auto-hold time should be of sufficient duration, for example above about 3 seconds, to ensure that the system has enough time to tune.

In some embodiments, depending on the chemistry used, the transition from CW mode to pulsing mode might be extremely pronounced in terms of plasma load. In such a case, the Pulse_Freq_Pulse mode may be effectively utilized for source pulsing. Once the system is tuned at 90% duty cycle, the transition to the desired duty cycle (for example, 30%) is smoother than switching from CW. In some embodiments, this technique may be utilized for processes operating at low pressure (e.g., below 10 mTorr).

Alternatively, in some embodiments, the system 100 may be operated in a synchronous pulsing mode. In such a mode, both the source and the bias generators should be in the same RF mode and in a master/slave configuration. A slave delay may be provided that is shorter than the pulse duration to ensure that the slave generator receives the synchronization signal.

As the case for source and bias pulsing, one can use the Pulse-Freq-SyncPulse in which the system starts operating in pulsed mode in a synchronized fashion with 90% duty cycle and then switches to the desired duty cycle. This is mainly recommended for low pressure processes (e.g., below about 10 mTorr).

Alternatively, in some embodiments, the system 100 may be operated in a back-to-back RF pulsing mode during which pulse frequency and/or duty cycle is changed during processing. In such a mode, a first step may be utilized as a stabilization step. A second step is a synchronized pulsing step similar to those discussed herein with the same considerations. The frequency tuning at both generators switches to on after 5 sec from turning on the RF in the second step. After 6 sec the system starts pulsing at 3 kHz and 60% duty cycle. Once the system reaches its steady state, i.e., tuning is achieved the actual frequency of the source and/or the bias generators might differ from the nominal value (e.g., 13.56 MHz) as the frequency tuning is on. In a third step the same tuned condition of the system may be maintained while switching the duty cycle of the generators to some other value. In order not to lose the frequency tuning, the RF is kept on by the end of the second step (as compared to turning the RF off and starting the process anew). In the third step the same RF modes are chosen as in the second step. However, in order to keep the generators in the pulse mode as well as in the frequency tuning mode, the timeouts for "CW/Pulse" and "Fixed/Freq" may be set to zero in both the source and bias generators. By so doing, the frequency tuning achieved in the second step is kept and the system reaches its steady state in the thirds step more quickly than if starting without the generators providing RF power and the system tuned. If the match was in hold by the end of the second step, it should also be in hold mode in the third step.

In some embodiments, applicable to any of the pulsing modes described herein, a special case of embedded pulsing may be utilized. In an embedded pulsing mode, one RF pulse is temporally embedded in another RF pulse. In other words, a first RF power supply may have a first on time and a second RF power supply may have a second on time that is less than or equal to the first on time. The second on time will be temporally situated with respect to the first on time such that the on time of the second RF power supply will never overlap with the off time of the first RF power supply. Thus, the shorter (or equal) on time for a pulse of one RF power supply overlaps completely with the longer (or equal) on time for a pulse of the other RF power supply. As an example, if the source RF power supply has a five second on time and a five second off time (a 50% duty cycle), the bias RF power supply may have an on time that is less than or equal to five seconds and that is temporally aligned such that the bias RF power supply is never on when the source RF power supply is off.

The processes described below for pulsed plasma processing can be applied to the matching networks for the source power, bias power or both. The techniques of some embodiments of the invention can be used to operate any tunable matching network and tunable frequency generator for efficiently applying pulsed RF power to a plasma within a plasma reactor. As such, the matching network and RF power supply may match the impedance of an RF power supply to the impedance of the plasma as driven by an antenna or electrode that is coupled to the matching network during a wider window of pulsed plasma processes.

RF Pulsing Procedures

Specific, Non-Limiting Examples

As mentioned previously, during certain plasma enhanced processes that are performed upon wafers, a substantial amount of charge may accumulate on the surface of the wafer. Such accumulation may cause significant damage to the wafer. In order to mitigate the charging effect and avoid its damage, the power supplied to plasma within plasma enhanced reactor may be pulsed. By utilizing RF pulsing for plasma processes a dynamic tuning system should be introduced in order to maximize the amount of energy coupled to the plasma from the RF-pulsed generator/s.

In conventional plasma processes, continuous wave (CW) RF power is delivered to the plasma reactor. A dynamic matching network ensures that the output of the RF source is efficiently coupled to the plasma i.e. minimize the power reflected back to the generator. As the plasma characteristics change during processing the matching network is continuously adjustable to ensure that a match is achieved and maintained throughout the processing, therefore, the matching network is in automatic mode. In general, a controller that executes the process recipe controls the matching network and adjusts the capacitance and/or inductance of the matching network to achieve a better match i.e. less reflected power. Adjusting the capacitance and/or the inductance is achieved by mechanically tuning a capacitor and/or inductor. Once the RF power delivered to the plasma reactor is pulsed the conventional matching network will not be able to tune the system to a reasonable low reflected power as the tuning process might be slow compared to the RF pulse duration. Therefore, when a pulsed RF signal is applied to the matching network it can't track the changes in the plasma impedance during the process and as a result continuous adjustment may cause excessive reflected power and a reduction in plasma power coupling efficiency. Hence, there is a crucial need for matching techniques and procedures when applying pulsed RF signals to a plasma reactor in order to ensure efficient operation in a plasma enhanced semiconductor wafer processing system. The matching problem gets critical in decoupled plasma source reactors when trying to apply RF pulsing to both the source and the bias generators while delivering the power.

Some embodiments of the present invention disclosed herein take advantage of an additional feature applied to the pulsed-RF generator in which it provides a fast frequency tuning. The main purpose behind introducing this feature is to reduce the power reflected to the generator by tuning the main RF operating frequency within a given range (~5%), and therefore, increasing the dynamic range for plasma matching. However, for plasma reactors that use matching network as their main matching system, the dynamic range of this frequency tuning is narrow, and accordingly it can't be used as a replacement for the conventional matching network when operating at CW mode. Moreover, enabling the frequency tuning in the RF generator, simultaneously with automatic adjustable matching network create a competition between the two tuning procedures, and hence, reduces the RF power coupling to plasma while operating at the CW mode.

Once pulsed RF is applied to the plasma reactor the frequency tuning feature can be utilize to jointly operate with the matching network in order to achieve lower reflected power, and therefore, enabling efficient pulsed plasma processes. Some embodiments of the present invention disclosed herein introduces efficient procedures for plasma impedance matching during RF pulsing based on a time-resolved tuning scheme. These procedures provide stable pulsed plasma within wide window of operation without the need for extra apparatus to be utilized in the system. However, for certain recipes one of these procedures gets into the tuned state much faster than the other one enabling short-time processes to take advantage of plasma pulsing.

In U.S. Pat. No. 6,818,562, by Valentin Todorow, et al., it was proposed to ignite the plasma in a CW mode, and once the plasma is ignited, the matching network adjusts itself automatically to ensure minimum reflected power. Once the desired matching is achieved the matching network tuning parameters are held constant and the system is switched into a pulse mode where the RF power is pulsed. However, the operational window revealed by this technique is narrow and it is almost impossible to achieve any stable pulse operation when trying to pulse both the source and the bias in a plasma reactor without utilizing frequency tuning.

In what follows, several procedures are introduced, each having a sequence of steps to be followed that facilitates stable operation while pulsing. By utilizing these procedures one should be able to significantly enhance the stable window of operation for pulsing mode paving the way for more plasma-based processes to take advantage of plasma pulsing regime. The procedures disclosed herein are mainly applied for plasma pulsing when both the source and the bias generators are in pulsing mode. However, the main concept of having fast frequency tuning combined with dynamic matching network operating in a time-resolved fashion for pulsed plasma operation may be implemented in a variety of applications. For example, the time-resolved tuning scheme is applicable for all of the following RF regimes: 1) source pulsing and bias in CW mode; 2) bias pulsing and source in CW mode; 3) source and bias both pulsing in a non-synchronized fashion; and 4) source and bias both pulsing in fully synchronized fashion or with phase control.

The two exemplary procedures that follow may be used for tuning when applying pulsing to both the source and the bias. The two following procedures are special cases of the time-resolved concept and are provided here as an example of efficient procedures for particular applications. Variations of the procedures described herein may be utilized for processes having varying parameters (e.g., chemistries, pressures, power levels, and the like). For example, the processes described above may be reversed or the steps performed in different sequences in order to provide and/or maintain a low reflected power.

Procedure #1: CW to Pulse

In this procedure the plasma is ignited in a CW mode, while having the source and the bias generators at fixed frequency (for example, about 13.56 MHz) and the matching networks in automatic mode. Once the matching networks adjust to ensure minimum reflected power from both the source and the bias (this process may take about 2-3 sec) the source matching network parameters are held constant while keeping the bias matching network in automatic mode. This followed by turning on the frequency tuning for the source generator while keeping it off for the bias generator. After about 1 sec the pulsing mode may be turned on, followed by turning on the frequency tuning for the bias generator and sending back the source matching network to an automatic mode. It takes another about 2-4 sec (depending upon the presets of the matching network and on the recipe's parameters) for the system to stabilize and achieve minimum reflected power. Now the system is ready to operate in a pulsing mode.

In summary:
1. Set the generators into Master/Slave mode to enable synchronized pulsing mode.
2. Set the generator to fixed frequency.
3. Set one of the pulsing frequency or the duty cycle at the source generator to zero.
4. Set the matching networks into auto mode.
5. Turn on the generators for CW operation.
6. As the CW mode is tuned turn the source match network into hold and keep the bias in auto mode.
7. Turn on the frequency tuning at the source generator.

8. Turn on the pulsing mode (by applying numbers different from zero at both the pulsing frequency and duty cycle at the source generator).
9. Turn on the frequency tuning at the bias generator.
10. Switch back the source matching network into auto mode.
11. The system is ready for pulsing operation.
12. Once the system is tuned, switch matching networks into hold mode. Under certain conditions you might skip step 10 and keep the source matching network on hold mode as set in step 6. For example, for high pressure processes (e.g., greater than about 10 mTorr) and for some low pressure processes, step 10 may be skipped.

Using this procedure, the inventors have yet to encounter a situation where the frequency tuning at the generator end and the automatic mode at the matching network end are operating simultaneously during CW mode, hence, avoiding the tuning algorithm competition that might cause instabilities. The differences in tuning the source against the bias are due to the fact that in the conventional decoupled plasma source reactors the matching network for the bias achieves lower reflected power than the source and for any practical purposes the reflected power from the bias is identically zero. Therefore, by switching the bias matching network into hold position and activating the frequency tuning while the system is in CW mode alters the zero reflected power as the generator try to achieve better tuning when it is impossible, and therefore, instability may occur. The latter is significant mainly for low pressure processes. This problem doesn't occur in the source as the reflected power achieved by the matching network is small however it is not identically zero, and therefore, there is a room for achieving lower reflected power by applying the fast frequency tuning while the matching network is on hold even in CW mode.

Procedure #2: Pulse to Pulse

This procedure relies mainly on the discovery that applying pulsing for both the source and the bias with duty cycle of about 90% (or between about 85-95%) at almost any pulsing frequency (typical frequencies used are in the range of 100 Hz-50 kHz) has been observed to behave pretty closely to CW mode, and therefore, it is quite easy to achieve low reflected power for the same recipe that can be run in CW mode. However, the main difference is the fact that the generators are running in pulsing mode, and accordingly, it is possible to have the matching network in automatic mode simultaneously with frequency tuning in the generators without getting into the competition regime. The sequence of steps to be followed in this procedure is as follows. Set the generators into pulsing mode with the desired pulsing frequency but with about 90% duty cycle (or between about 85-95%). Turn on the frequency tuning for both the bias and the source and set the matching networks into an automatic mode. After doing so, turn on the generators. It will take the system about 2-3 sec to stabilize and adjust itself to the minimum reflected power. Afterward, while the generators are still on, change the duty cycle from about 90% to the desired duty cycle within the window of operation. It will take the system another 2-3 sec to tune itself and then it is ready for operation at the desired pulsing mode.

In summary:
1. Set the generators into Master/Slave mode to enable synchronized pulsing mode.
2. Set the generators to frequency sweep.
3. Set the source generator duty cycle to about 90% (or between about 85-95%) and the pulsing frequency to the desired frequency of operation.
4. Set the matching networks into auto mode.
5. Turn on the generators for pulsing modes.
6. When tuned, switch the duty cycle to the desired duty cycle.
7. The system is ready to operate at pulsing operation.
8. Once the system is tuned (2-3 sec after step 7) switch the matching networks into hold mode. Under certain conditions it will be recommended to switch the matching networks into hold mode after tuning the system in step 6 but before switching the duty cycle to the desired value. In such situations, step 8 is not needed and may be omitted.

In both aforementioned procedures, while pulsing, the source and the bias pulses may be fully synchronized (e.g., the phase between the pulses' envelope is zero at any given time). Without having the pulses synchronized it is much harder to achieve low reflected power while the source and the bias are pulsed simultaneously. However, based on the time-resolved procedure presented before one can obtain low reflected power even when the phase between the pulses is not zero.

In addition, the procedures introduced here enlarge the dynamic range for plasma impedance matching. However, they enhance significantly the window of operation for plasma pulsing enabling a larger number of processes to take advantage of this regime. The dynamic range is dictated mainly by two features. The first is the dynamic range of the capacitors/inductors of the matching network. The second is the frequency tuning range in the generator. Modifying these two features enable to change the effective window of operation for pulsing mode.

The main parameter characterizing the running recipe that dictates which one of the aforementioned procedures to be used is the pressure set point. Two families of operation can be distinguished, the first is low pressure operation (for example, below about 10 mTorr for Si etch) and the second is high pressure operation. Both aforementioned procedures enable stable tuning of the system while operating with pulsing mode within the stable window of operation. For high pressure operation both methods reveal similar results within the same time frame. However, for lower pressure operation the second method is faster (3-4 seconds, versus 6 seconds).

While the foregoing is directed to embodiments of the present invention, other and further embodiments of the invention may be devised without departing from the basic scope thereof.

The invention claimed is:

1. An apparatus, comprising:
a first RF power supply having frequency tuning;
a first matching network coupled to the first RF power supply; and
a first common sensor for reading a reflected RF power reflected back to the first RF power supply and for providing a signal indicative of the reflected RF power to tune the first RF power supply and the first matching network.

2. The apparatus of claim 1, further comprising:
a controller for tuning the first RF power supply and the first matching network based upon the reading from the first common sensor.

3. The apparatus of claim 2, wherein the first matching network is embedded within the first RF power supply, and wherein the controller controls both tuning of the first matching network as well as a frequency with an RF cycle based on a common reading provided by the first common sensor as measured at an output of the first RF power supply.

4. The apparatus of claim 1, further comprising:
a process chamber having an antenna assembly disposed proximate a lid of the process chamber and a cathode pedestal for supporting a substrate to be processed, wherein the first RF power supply is coupled to the antenna assembly; and a second RF power supply having frequency tuning coupled to the cathode pedestal, a second matching network coupled to second RF power supply, and a second common sensor for reading reflected RF power reflected back to the second RF power supply, the second common sensor coupled to the second RF power supply and the second matching network.

5. The apparatus of claim 4, further comprising:

a controller for tuning the first RF power supply and the first matching network based upon the reading from the first common sensor and for tuning the second RF power supply and the second matching network based upon the reading from the second common sensor.

6. The apparatus of claim 5:

wherein the first matching network is embedded within the first RF power supply and the controller controls both tuning of the first matching network as well as a frequency with an RF cycle of the first RF power supply based on a common reading provided by the first common sensor as measured at an output of the first RF power supply; and wherein the second matching network is embedded within the second RF power supply and the controller controls both tuning of the second matching network as well as a frequency with an RF cycle of the second RF power supply based on a common reading provided by the second common sensor as measured at an output of the second RF power supply.

7. The apparatus of claim 4, further comprising:

a link coupling the first RF power supply and the second RF power supply to facilitate synchronizing the operation of one RF power supply to the other.

8. The apparatus of claim 7, wherein the first RF power supply and the second RF power supply are configured to operate in perfect synchronization or in a desired phase difference.

9. The apparatus of claim 4, wherein the first RF power supply and the second RF power supply can operate in a pulse mode having a pulse frequency of between about 100 Hz to about 100 kHz.

10. The apparatus of claim 4, wherein the first RF power supply and the second RF power supply can operate at a duty cycle of between about 10 to about 90 percent.

11. A method for tuning a system operating a plasma process using a source RF power supply and a bias RF power supply, each capable of frequency tuning and respectively coupled to a process chamber via a source matching network and a bias matching network, the method comprising:

igniting a plasma in a process chamber using the source RF power supply and the bias RF power supply, each set in a continuous wave mode and in a fixed frequency mode, with the source matching network and the bias matching network each set in an automatic tuning mode;

changing the source matching network to hold mode while keeping the bias matching network in automatic mode after the matching networks adjust to reduce reflected power from both the source and the bias RF power supplies;

turning on frequency tuning for the source RF power supply while keeping it off for the bias RF power supply;

turning on a pulsing mode for the source RF power supply and/or the bias RF power supply; and placing the bias RF power supply in frequency tuning mode.

12. The method of claim 11, further comprising:

returning the source matching network to automatic mode after placing the bias RF power supply in frequency tuning mode.

13. The method of claim 11, wherein the source RF power supply and the bias RF power supply are in a master/slave arrangement to provide synchronized or embedded synchronized pulsing.

14. The method of claim 11, wherein the source RF power supply and the bias RF power supply are each in a master mode to operate the source RF power supply in pulsing mode with the bias RF power supply in continuous wave mode or the bias RF power supply in pulsing mode with the source RF power supply in continuous wave mode.

15. A method for tuning a system operating a plasma process using a source RF power supply and a bias RF power supply, each capable of frequency tuning and respectively coupled to a process chamber via a source matching network and a bias matching network, the method comprising:

(a) forming a plasma in a process chamber by providing RF power from the source RF power supply and/or the bias RF power supply at a desired pulsing frequency and an initial duty cycle of between about 85 to about 95 percent in frequency tuning mode with the source matching network and the bias matching network in automatic tuning mode; and (b) while the source RF power supply and the bias RF power supply are still on, changing the initial duty cycle to a desired duty cycle after the matching networks adjust to reduce reflected power from both the source and the bias RF power supplies.

16. The method of claim 15, wherein the initial duty cycle is about 90 percent.

17. The method of claim 15, further comprising:

(c) switching the matching networks into hold mode after changing the initial duty cycle to a desired duty cycle.

18. The method of claim 15, further comprising:

(c) switching the matching networks into hold mode after the matching networks adjust to reduce reflected power from both the source and the bias RF power supplies but prior to changing the initial duty cycle to a desired duty cycle.

19. The method of claim 15, wherein the source RF power supply and the bias RF power supply are in a master/slave arrangement to provide synchronized or embedded synchronized pulsing.

20. The method of claim 15, wherein the source RF power supply and the bias RF power supply are each in a master mode to operate the source RF power supply in pulsing mode with the bias RF power supply in continuous wave mode or the bias RF power supply in pulsing mode with the source RF power supply in continuous wave mode.

21. A method for tuning a system operating a plasma process in a time resolved manner using a source RF power supply and a bias RF power supply, each capable of frequency tuning and respectively coupled to a process chamber via a source matching network and a bias matching network, the method comprising:

igniting a plasma in a process chamber using the source RF power supply and the bias RF power supply, each independently set in a first operational mode selected from either a continuous wave mode or a pulsing mode and in a first tuning mode selected from either a fixed frequency mode or a frequency tuning mode, with the source matching network and the bias matching network each independently set in a first match mode selected from either an automatic tuning mode or a hold mode;

upon expiration of a first period of time, switching the first operational mode of one or both of the source RF power supply and the bias RF power supply;

upon expiration of a second period of time, switching the first tuning mode of one or both of the source RF power supply and the bias RF power supply; and upon expiration of a third period of time, switching the first match mode of one or both of the source matching network and the bias matching network;

wherein the first, second, and third periods of time are selected to reduce a reflected power reflected back to the source RF power supply and the bias RF power supply.

* * * * *

UNITED STATES PATENT AND TRADEMARK OFFICE
CERTIFICATE OF CORRECTION

PATENT NO. : 8,264,154 B2
APPLICATION NO. : 12/465319
DATED : September 11, 2012
INVENTOR(S) : Samer Banna et al.

Page 1 of 1

It is certified that error appears in the above-identified patent and that said Letters Patent is hereby corrected as shown below:

On the Title page in field (12), in column 1, delete "Banner" and substitute therefor --Banna--;

On the Title page, in field (75), under "Inventors", in column 1, line 1, delete "Banner" and substitute therefor --Banna--.

Signed and Sealed this
Fifth Day of February, 2013

Teresa Stanek Rea
*Acting Director of the United States Patent and Trademark Office*